United States Patent
Mou et al.

(10) Patent No.: US 8,902,591 B2
(45) Date of Patent: Dec. 2, 2014

(54) HEAT DISSIPATION DEVICE

(75) Inventors: Hao Jan Mou, Hsin-CHu (TW); Ta Wei Hsueh, Hsin-Chu (TW); Ying Lun Chang, Hsin-Chu (TW); Shih Chang Chen, Hsin-Chu (TW); Yung Lung Han, Hsin-Chu (TW); Chi Feng Huang, Hsin-Chu (TW)

(73) Assignee: Microjet Technology Co., Ltd., Hsin-Chu (TW)

( * ) Notice: Subject to any disclaimer, the term of this patent is extended or adjusted under 35 U.S.C. 154(b) by 166 days.

(21) Appl. No.: 13/464,507

(22) Filed: May 4, 2012

(65) Prior Publication Data

US 2012/0287655 A1 Nov. 15, 2012

(30) Foreign Application Priority Data

May 11, 2011 (CN) .......................... 2011 1 0128904

(51) Int. Cl.
*H05K 7/20* (2006.01)

(52) U.S. Cl.
CPC .................................. *H05K 7/20254* (2013.01)
USPC ................. 361/709; 361/679.53; 361/679.54; 361/699; 174/548; 257/712; 62/3.7

(58) Field of Classification Search
USPC ........................ 361/676–678, 679.46–679.54, 361/688–722, 752, 831
See application file for complete search history.

(56) References Cited

U.S. PATENT DOCUMENTS

| 6,785,134 | B2* | 8/2004 | Maveety et al. | 361/699 |
| 6,992,382 | B2* | 1/2006 | Chrysler et al. | 257/717 |
| 2002/0039280 | A1* | 4/2002 | O'Connor et al. | 361/690 |
| 2004/0104012 | A1* | 6/2004 | Zhou et al. | 165/104.26 |
| 2005/0094397 | A1* | 5/2005 | Yamada et al. | 362/253 |
| 2005/0205241 | A1* | 9/2005 | Goodson et al. | 165/80.4 |
| 2007/0006996 | A1* | 1/2007 | Mikubo et al. | 165/104.33 |
| 2007/0227708 | A1* | 10/2007 | Hom et al. | 165/121 |
| 2008/0266787 | A1* | 10/2008 | Gosset et al. | 361/689 |
| 2011/0232872 | A1* | 9/2011 | Mou et al. | 165/104.19 |

FOREIGN PATENT DOCUMENTS

| TW | 200726392 | 7/2007 |
| TW | I326027 | 6/2010 |

* cited by examiner

*Primary Examiner* — Courtney Smith
(74) *Attorney, Agent, or Firm* — Muncy, Geissler, Olds & Lowe, P.C.

(57) ABSTRACT

The present invention relates to a heat dissipation device, which comprises: a fluid, a fluid delivery device, and a circular pipe. The fluid delivery device is for propelling and delivering the fluid, the circular pipe is connected with the fluid delivery device, at least a portion of the circular pipe itself contacting with a heat generation device for conducting heat to the portion of the circular pipe, so as letting the fluid to be delivered by the fluid delivery device for delivering heat to the rest portion of the circular pipe, and to dissipate the heat generation device.

8 Claims, 7 Drawing Sheets

HEAT DISSIPATION DEVICE

BACKGROUND OF THE INVENTION

1. Field of the Invention

The present invention relates to a heat dissipation device and, more particularly, to a heat dissipation device which dissipates a heat generation device through fluid delivery.

2. Description of Related Art

In recent years, with the rapid development of electronic technology and the demand for consumers on slight, thin, and easy-to-take consumer electronics products, modern electronics products such as tablet computer, laptop computer, mobile phone, or the like portable electronics devices are made toward micro-size gradually. With this, portable electronics devices become easier to be taken for users that often traveling outside, and the convenience is raised abundantly as well.

However, for modern portable electronics devices, in addition to satisfy the abovementioned slight and thin figure, miscellaneous functions are further added thereon. This makes the operation speed of the interior electronic element inside portable electronics devices to be extremely fast. Further, with the effect of the size of the electronic element is small; the heat value of area per unit increases then as well. If the heat energy accumulated on the electronic element cannot be dissipated timely, the stability and efficiency of the electronic element while under operation will be affected severely due to excessively high temperature, and even damage the device or shorten the lifetime of the device.

In order to solve the problem of heat dissipation of portable electronics devices, to install a heat dissipation fan inside the electronic devices is a conventional mean for dissipating the heat of electronics devices, and further for lowering the ambient temperature inside the devices. However, for maintaining the size of the portable electronics devices to be slight and thin and small, the inner free space of the devices is very limited after the essential space covered by circuit layout and other relative electronics elements is subtracted, which implies to install a heat dissipation fan is quite difficult. Moreover, fan with larger size must be chosen for heat dissipation in accordance to the overall heat dissipation efficiency of portable electronics devices, to satisfy the demand of devices on heat dissipation. Therefore, the ordinary position of the interior circuit of portable electronics devices should be altered to match with the fan, this causes the consequence of high cost, and the size of portable electronics devices increases therewith as well. That is, the result does not fit with the consumer's demand for wanting slight, thin, and small portable electronics devices.

Additionally, the conventional fan conducts a great amount of air while under operation, which results in generation of wind shear sound then leads to noise with constant frequency. If a heat dissipation fan is disposed in a conventional slight portable electronics device, then the noise generated by the fan can transmit directly to the external of the device due to factors that the distance the traveling path of noise is shorter and the noise is not blocked by and substance. Therefore, severe noise problem appears, and the noise problem is presently one of the main issues that desired to be overcome by the researchers in the relative technical field.

In addition to portable electronics devices, other general electronics devices are confronting problems of heat dissipation as well due to high order design of the interior electronics elements thereof; for example, the CPU installed in the electronics devices. In order to satisfy the huge demand of consumers and various kind of application software, the circuit layout is more complicated than earlier period. Despite the integrated circuit chip of the CPU provides lots of mighty functions, however, it also consumes a great amount of electrical power due to complicated circuit design. The electrical power causes increment of temperature of the chip, and leads to critical problems. The problem deteriorates even sternly especially for server device.

Generally speaking, in order to make server device to achieve maximum efficiency, it is quite important to transmit heat out of the system rapidly. When the heat accumulates inside the server and cannot be dissipated promptly, this will make electronics elements unable to operate, even makes the entire server device to shut down. Therefore, when a conventional server device is under operation, fan with high wattage is used in order to increase the ability of heat dissipation. In one aspect, although the fan with high wattage can generate a lager amount of wind and can increase the efficiency of heat dissipation, but in another aspect, it generates problem of noise due to its high wattage, electromagnetic pole number, rotation speed, blade number, and etc factors.

In addition to electronics devices and the like heat generation devices, other kinds of heat generation devices such as lighting devices, are confronting the same problems as well. Among various lighting devices, LED contributes tremendously on prevention of greenhouse effect and environmental greening to Earth due to the low amount of $CO_2$ emission during the process of electricity generation. Furthermore, LED meets the demand of environmental protection and energy saving nowadays, and has gradually replace traditional incandescent lamp and fluorescent lamp in lighting industry. However, in order to make LED lighting device to have wider and higher illumination, method such as connecting plural of LEDs in series or in parallel to form a set for traffic signal light, street lamp, vehicle lamp and the like is taken to increase the area of LED, and each LED is to illuminate by electrifying the semiconductor material through the chip. Therefore, when higher illumination is desired for the conventional LED lighting device, higher current consumption it takes, and of course the heat energy generated thereof increases as well. By this, the operation temperature of LED devices increases as well. If the operation temperature exceeds too much, it is possible to weaken the illumination or decrease the lifetime of the devices.

For the reasons described above, how to develop a heat dissipation device with good heat dissipation efficiency, small size, low power consumption, and suitable for portable electronics devices, electronics devices, lighting devices, and the like heat generation devices has become the most desired subject to the field for improving the pending problems caused by conventional technique.

SUMMARY OF THE INVENTION

The main object of the present invention is to provide a heat dissipation device, which dissipates the heat of a heat generation device mainly through fluid delivery.

To achieve the object, a broader aspect of the present invention is to provide a heat dissipation device comprising: a fluid; a fluid delivery device, for propelling and delivering the fluid; and a circular pipe connecting with the fluid delivery device, at least a portion of the circular pipe itself contacting with a heat generation device for conducting heat to the portion of the circular pipe, so as letting the fluid to be delivered by the fluid delivery device for delivering heat to the rest portion of the circular pipe, and to dissipate the heat generation device.

To achieve the object, another broader aspect of the present invention is to provide a heat dissipation device comprising:

a fluid; a fluid delivery device, for propelling and delivering the fluid; a heat absorption device connecting with a heat generation device, for absorbing the heat generated by the heat generation device; and a circular pipe connecting with the fluid delivery device and the heat absorption device, so as letting the heat absorbed by the heat absorption device to be conducted to the circular pipe by the fluid; wherein the fluid flows circularly in the circular pipe, and to dissipate the heat generation device.

DETAILED DESCRIPTION OF THE PREFERRED EMBODIMENT

Figure 1:
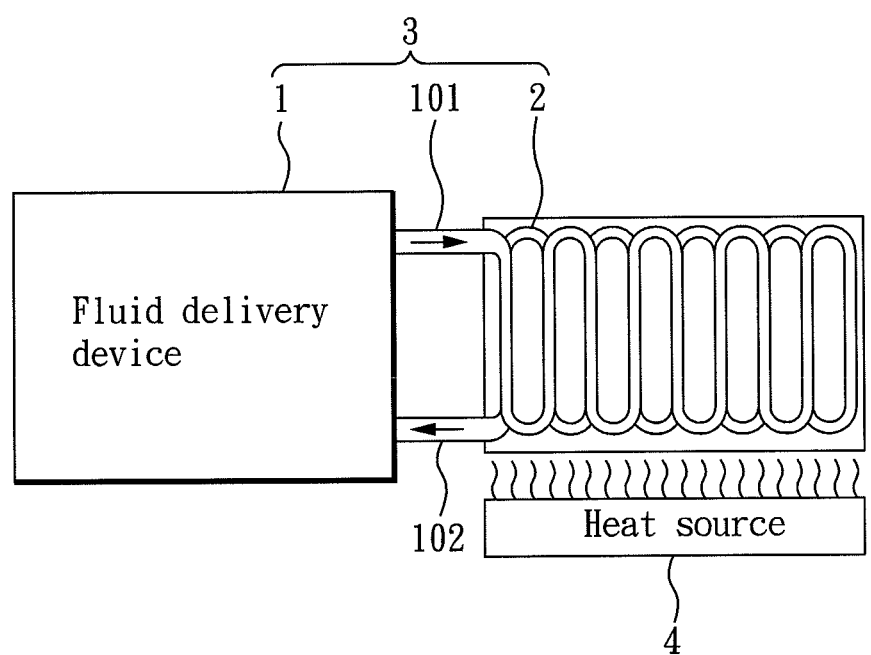
FIG. 1 is a schematic diagram displaying the structure of the heat dissipation device according to the first preferred embodiment of the present invention.

Other objects, advantages, and novel features of the invention will become more apparent from the following detailed description when taken in conjunction with the accompanying drawings. The description and the drawing in the specification of the present invention are essentially used for explanation only; they are not supposed to be used for limiting the scope of the present invention.

Figure 2A:
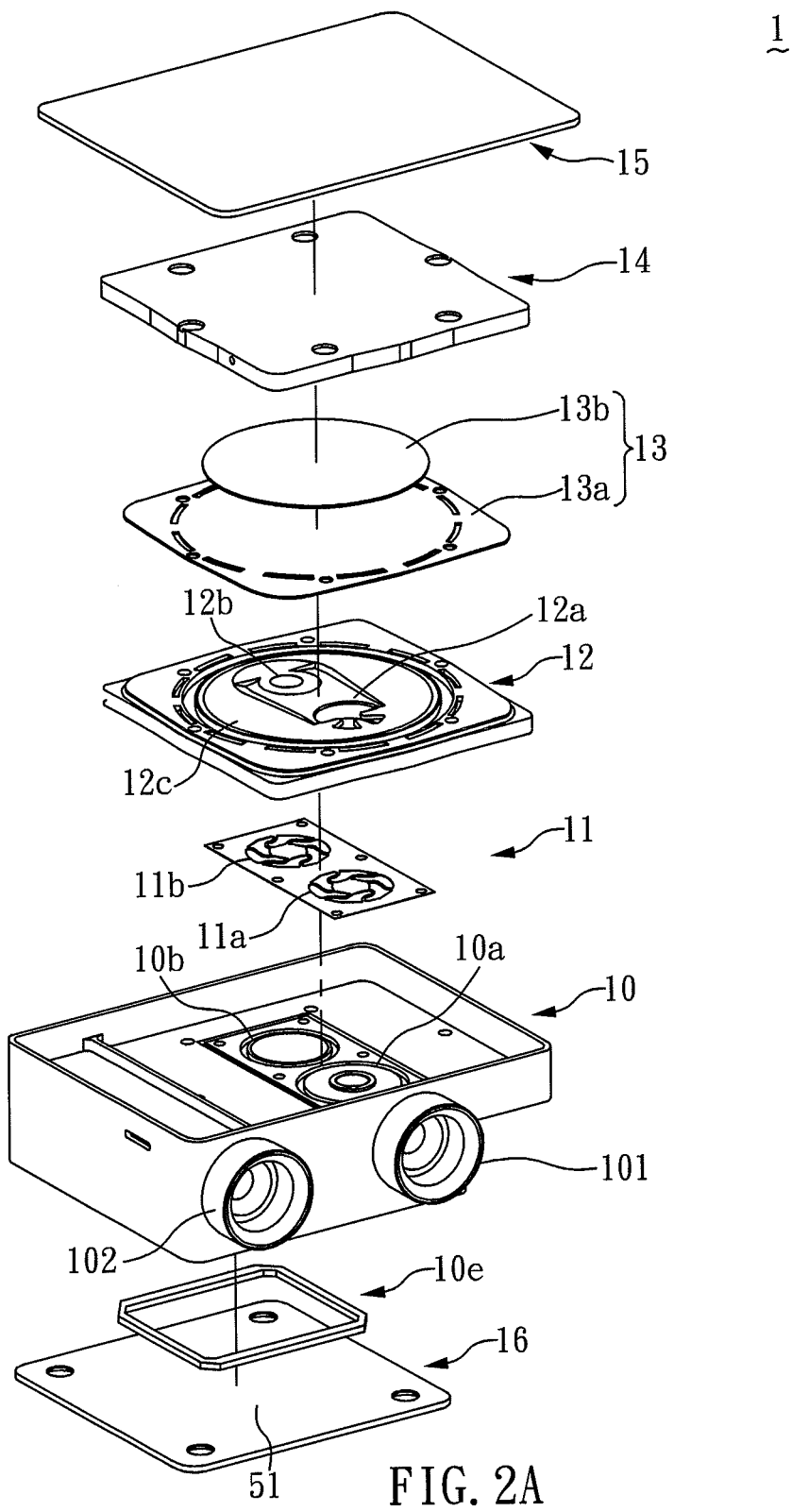
FIG. 2A is a schematic diagram displaying the decomposition structure viewed at front of the fluid delivery device as displayed in FIG. 1.

Please refer to FIG. 1, which is a schematic diagram displaying the structure of the heat dissipation device according to the first preferred embodiment of the present invention. As shown in FIG. 1, the heat dissipation device 3 is mainly composed of a fluid delivery device 1 and a circular pipe 2, wherein the fluid delivery device 1 has an actuating device 13 (as shown in FIG. 2A) and is connected with the circular pipe 2. Moreover, the circular pipe 2 contacts with the heat generation device 4. In the present embodiment, the two ends of the circular pipe 2 respectively connect with the inlet 101 and the outlet 102 of the fluid delivery device 1, so as letting the circular pipe 2 and the fluid delivery device 1 to form a close loop when the fluid is in liquid form, or letting the circular pipe 2 and the fluid delivery device 1 to form a open loop when the fluid is in gas form. By this, when the actuating device 13 of the fluid delivery device 1 is under operation, a fluid is able to be propelled to flow form the outlet 102 of the fluid delivery device 1 to the circular pipe 2. By the flow the fluid, the heat energy can be delivered to at least a portion of the circular pipe 2. This makes the heat generation device 4 to have heat exchange, and lets the heat generated by the heat generation device 4 to be delivered circularly with the flow of the fluid, so as letting the fluid to be delivered by the fluid delivery device 1 for delivering the heat energy to the rest portion of the circular pipe 2. Finally, the fluid with heat energy is delivered from the inlet 101 back to the fluid delivery device 1 for dissipating the heat generation device 4.

Take the present embodiment as instance, at least a portion of the circular pipe 2 contacts with the heat generation device 4, for exchanging heat with the heat generation device 4. But for some other embodiments, the circular pipe 2 can be, but not limited to, disposed inside the heat generation device 4, or even formed integrally with the heat generation device 4. Additionally, the circular pipe 2 can further have heat dissipation fins, or to be fabricated with another heat dissipation fin structure to increase the efficiency of heat dissipation. The design form for heat dissipation of the circular pipe 2 can be altered according to different instances and is not limited to the aforementioned implementation.

Please refer to FIG. 2, which is a schematic diagram displaying the decomposition structure viewed at front of the fluid delivery device as displayed in FIG. 1. As shown in the figure, the fluid delivery device 1 from top to bottom is composed of a top cover body 15, a cover body 14, an actuating device 13, a valve cover body 12, a valve film 11, a valve base 10, and a bottom cover body 16 in order. The manner of the composition is to dispose the valve film 11 in between the valve base 10 and the valve cover body 12 for stacking with each other, and to dispose the actuating device 13 onto the corresponding position of the valve cover body 12. The actuating device 13 is for driving the operation of the fluid delivery device 1, and is composed of a vibrating film 13a and an actuator 13b. Moreover, the vibrating film 13a is separated from the valve cover body 12 for forming a pressure chamber 12c when under no operation.

The valve base 10 has an inlet channel 101 and an outlet channel 12; the fluid is delivered through the inlet channel 101 to the opening 10a of the valve base 10, and then delivered to the valve film 11. When the fluid is delivered downwardly from the valve film 11, it can flow through the opening 10b and then expelled by the outlet channel 102 of the valve body 10.

Figure 2B:
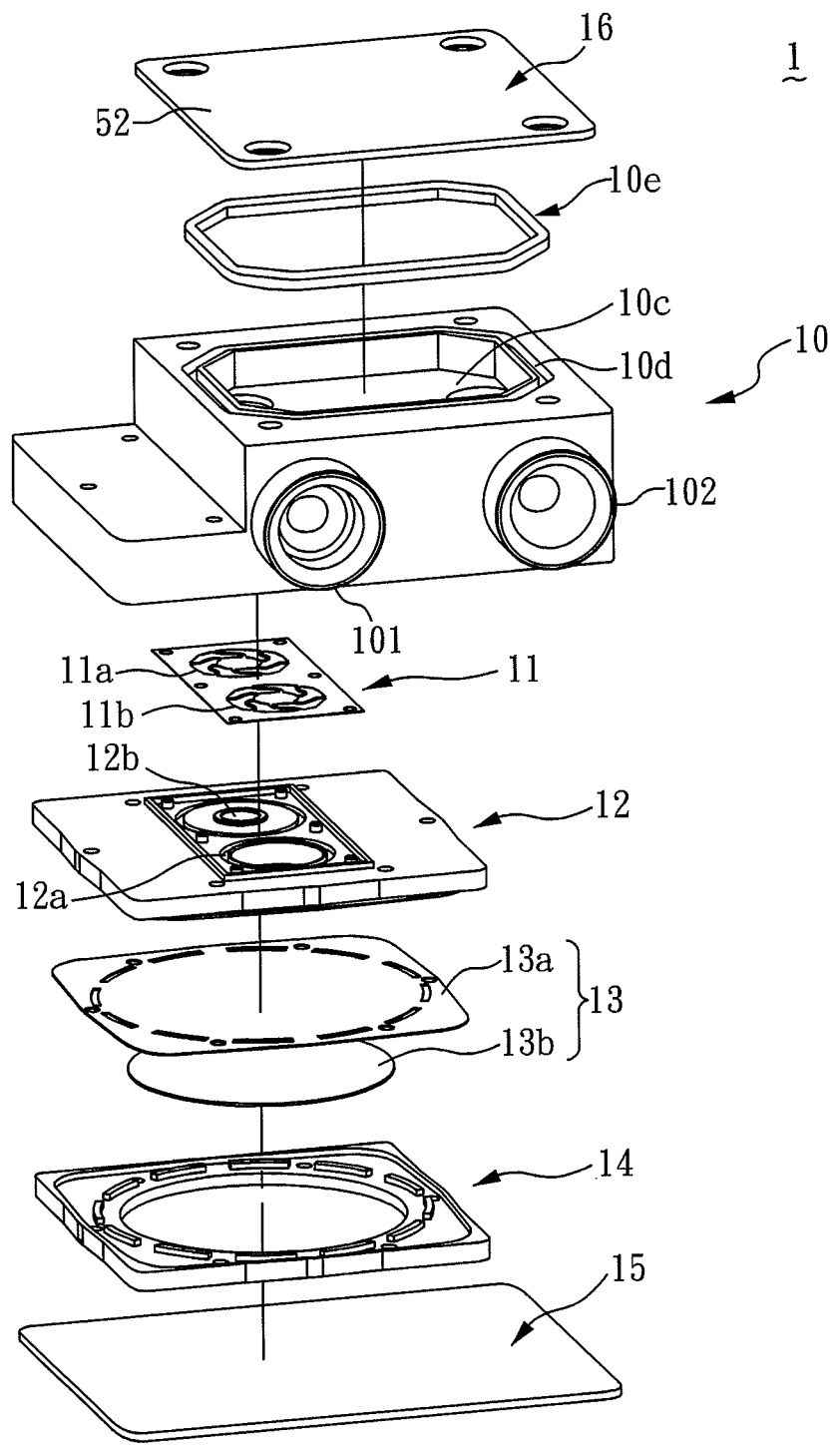
FIG. 2B is a schematic diagram displaying the decomposition structure viewed at rear of the fluid delivery device as displayed in FIG. 2A.

Please refer to FIG. 2A and FIG. 2B simultaneously, the valve film 11 is mainly a film structure with substantially the same thickness, it has a plurality of hollow valve switch thereon, the hollow valve switch comprises a first valve switch and a second valve switch. In the present embodiment, the first valve switch is an entrance valve structure 11a, and the second valve switch is an exit valve structure 11b. The valve cover body 12 has an entrance valve channel 12a and an exit valve channel 12b correspond to the entrance valve structure 11a and the exit valve structure 11b respectively. Additionally, a surface of the valve cover body 12 has a pressure chamber 12c disposed correspondingly to the actuator 13b of the actuating device 13, besides, the pressure chamber 12c connects with the entrance valve channel 12a and the exit valve channel 12b.

Moreover, the fluid delivery device 1 can further have a plurality of depression structures for a sealing ring (not shown in the figure) to be disposed thereon. By disposing the sealing ring in the depression structures, two adjacent structures can attach with each other tightly. For example, the fluid is prevented from leakage in between the valve base 10 and the bottom cover body 16 through the tight connection between the sealing ring 10e and the depression structure 10d that surrounds the liquid reservoir 10c. Likewise, similar structure is disposed in between the valve cover body 12 and the valve film 11, or in between the valve cover body and the actuating device 13, for achieving the purpose of tight connection and to prevent fluid from leakage by the combined fabrication of the depression structure and the sealing ring.

In the present embodiment, when the actuator 13b of the fluid delivery device 1 is driven by a voltage, the actuating device 13 comes to a deformation of bending upwardly, letting the volume of the pressure chamber 12c to change, further to generate pressure difference to propel the fluid into the pressure chamber 12c through the inlet channel 101 and the entrance valve structure 11a. Moreover, the fluid flows to the outlet channel 102 through the exit valve structure 11b and the opening 10b. As shown in FIG. 1, the fluid flows into the circular pipe 2 from the outlet channel 102, and flows along with the channel of the circular pipe 2. The fluid exchange heat with the heat generation device 4, and flows back to the fluid delivery device 1 through the inlet channel 101 at final, for achieving the purpose of dissipating the heat of the heat generation device 4 by the flowing of the fluid.

Since the fluid delivery device 1 carries advantages of small volume, high efficiency of heat dissipation, and low noise, this makes the fluid delivery device 1 to be suitable for heat generation device 4, which is slight and thin. For example, the heat generation device 4 can be, but not limited to, an LED lighting device, such as traffic signal light, street lamp, or vehicle lamp. In some other embodiments, the heat generation device 4 can be, but not limited to, an electronics device, such as a server, a tablet computer, a laptop computer, or other electronics devices that generate heat energy. In some other embodiments, the heat generation device 4 can further be, but not limited to, a hand-held communication device. It can be seen that the range of application of the heat dissipation device 3 is broad, and is not limited to the heat generation device 4 as disclosed above. For any sorts of heat generation device 4 with small volume, high heat generation, and are unsuitable for heat dissipation fan, can adopt the heat dissipation device 3 of the present invention.

Figure 3A:
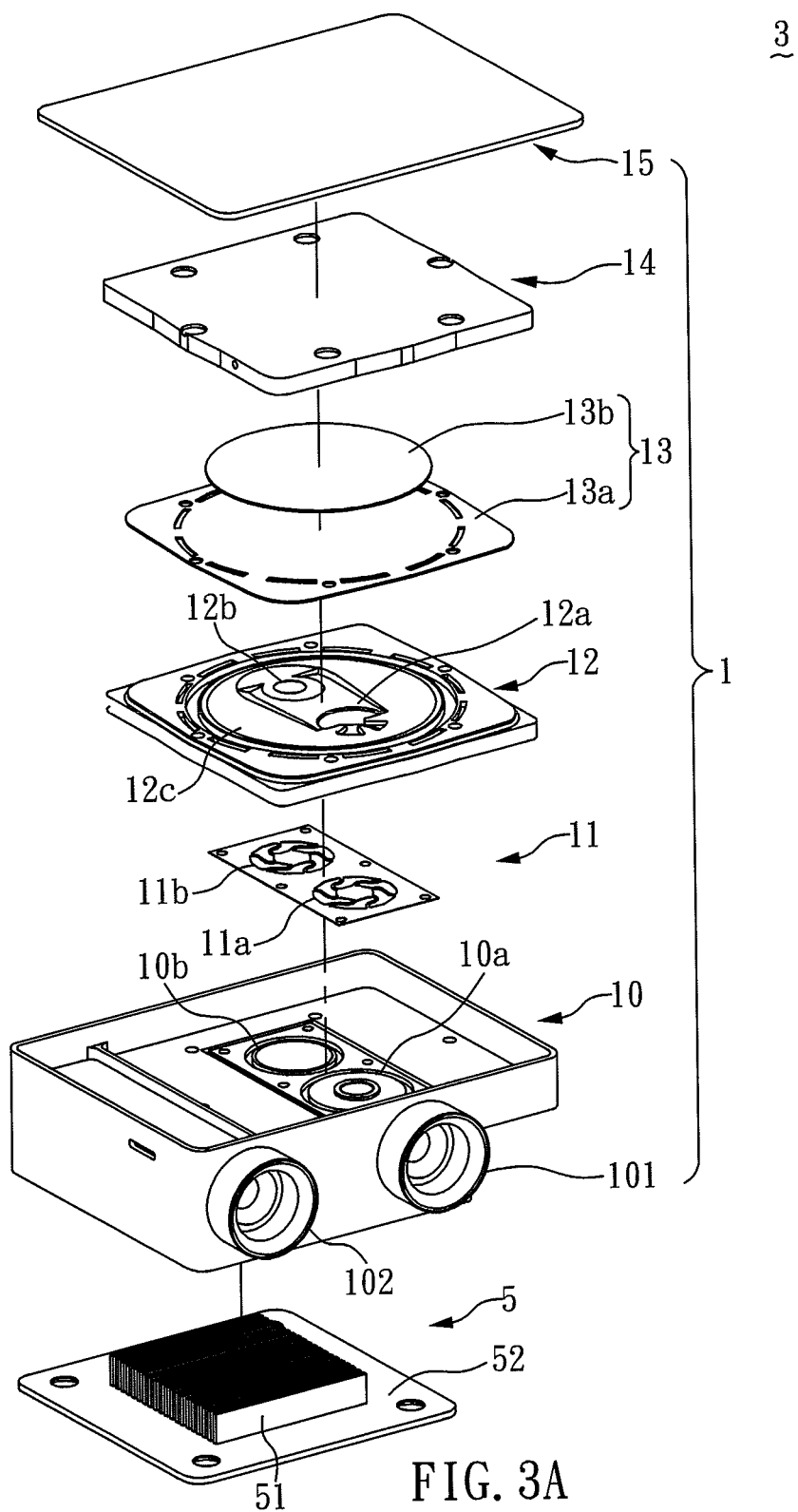
FIG. 3A is a schematic diagram displaying the decomposition structure viewed at front of the fluid delivery device according to the second preferred embodiment of the present invention.
Figure 3B:
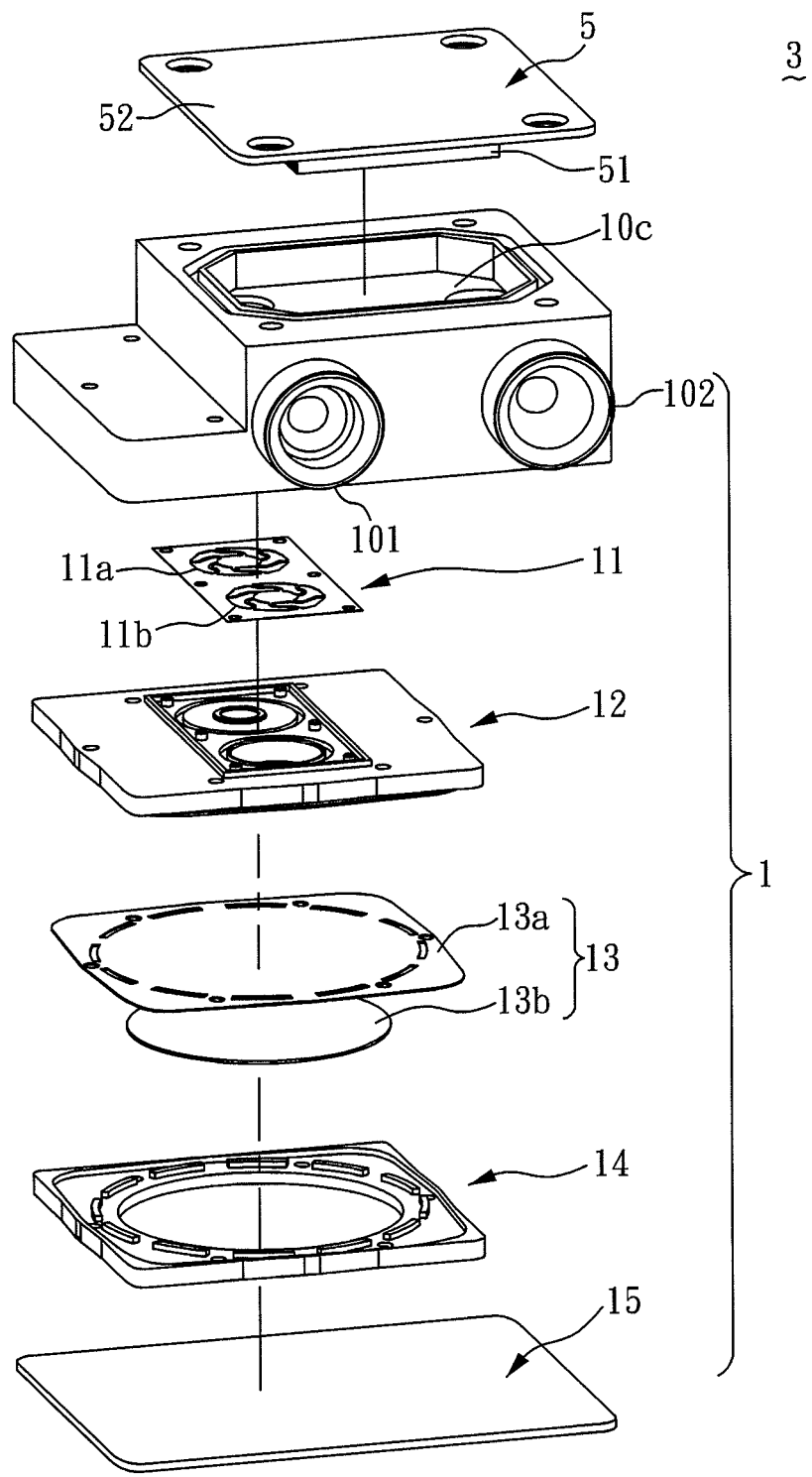
FIG. 3B is a schematic diagram displaying the decomposition structure viewed at rear of the fluid delivery device as displayed in FIG. 3A.

Please refer to FIG. 3A and FIG. 3B, FIG. 3A is a schematic diagram displaying the decomposition structure viewed at front of the fluid delivery device according to the second preferred embodiment of the present invention, and FIG. 3B is a schematic diagram displaying the decomposition structure viewed at rear of the fluid delivery device as displayed in FIG. 3A. In the present embodiment, the structure and the manner of fabrication of the fluid delivery device 1 of the heat dissipation device 3 are similar to that of the previous embodiment, it is mainly composed of a top cover body 15, a cover body 14, an actuating device 13, a valve cover body 12, a valve film 11, and a valve base 10 and the detail description is omitted for convenience thereby. However, the heat dissipation device 3 can further comprise a heat absorption device 5 in the present embodiment. As shown in FIG. 3A, the heat absorption device 5 can be fabricated with the valve base 10 together, so as the heat absorption member 51 of the heat absorption device 5 is located in the liquid reservoir 10c. With the above description, the fluid flows through the channel 53 of the heat absorption member 51 when the fluid flows into the liquid reservoir 10c through the opening 10b of the valve base 10, and then flows out of the device through the outlet channel 102 of the valve base 10. Additionally, the manner of the fabrication of the fluid delivery device 1 in the present embodiment is similar to that of the previous embodiment, it is mainly to stack the cover body 14, the actuating device 13, the valve cover body 12, and the valve film 11 in order in the valve base 10. After then, install the heat absorption device 5 under the valve base 10 correspondingly for letting the bottom plate 52 of the heat absorption device 5 to close the liquid reservoir 10c at the bottom surface of the valve base 10. In the meantime, install a top cover body 15 on the valve body 10 for finishing the fabrication of fluid delivery device 1 and the heat absorption device 5, and a close-loop fluid device is formed as well.

Figure 4:
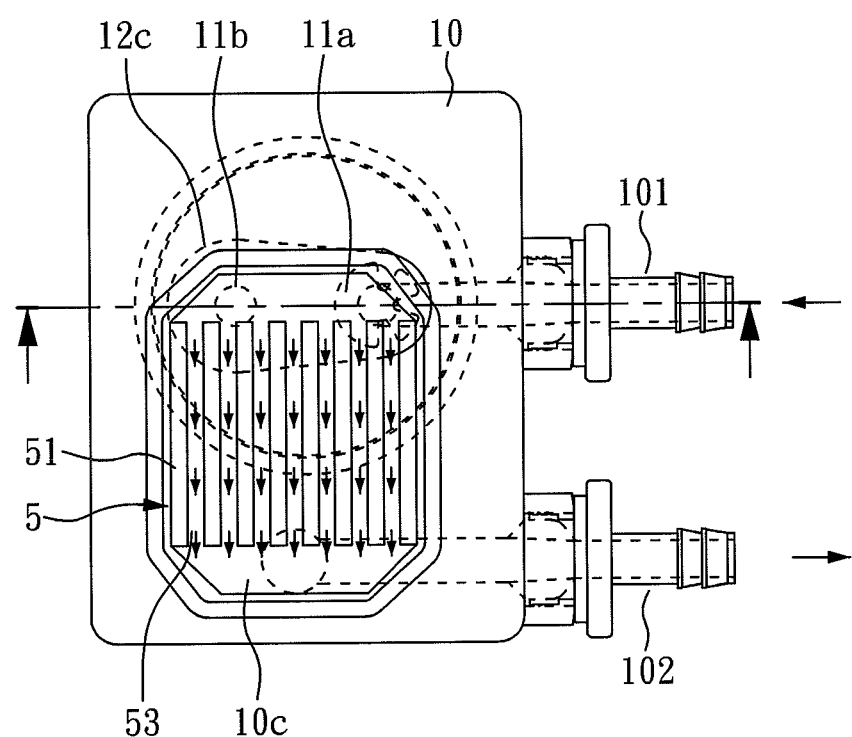
FIG. 4 is a schematic diagram displaying the top view of the fluid delivery device as displayed in FIG. 3A.

Please refer to FIG. 4, which is a schematic diagram displaying the top view of the fluid delivery device as displayed in FIG. 3A. As shown in FIG. 4, the inlet channel 101 and the outlet channel 102 in the present embodiment are disposed, but not limited to, at the same side of the valve base 10. Besides, the inlet channel 101 is connected with the entrance valve structure 11a, for letting the volume of the pressure chamber 12c to change when the actuating 13 is deformed to bent when driven by a voltage, further to generate pressure difference to propel the fluid into the pressure chamber 12c from the inlet channel 101 and through the entrance valve structure 11a. Moreover, the fluid flows along the channel 53 of the heat absorption device 5 and expelled from the outlet channel 102, for achieving the purpose of dissipating the heat.

Furthermore, the heat absorption device 5 is generally a plate-shape structure with plural of heat dissipation structures 51 disposed thereon. Take the present embodiment as instance; heat absorption members 51 can be, but not limited to, a vertical type fin structure. Moreover, each of the heat absorption members 51 is disposed in parallel with each other for defining plural of channels 53, for letting the fluid can flow within the plural of channels 53, and to contacts with the adjacent heat absorption member 51 during the process of flowing. In some embodiments, the heat absorption member 51 can be made of, but not limited to, heat absorption material such as metal material, so as letting the fluid to deliver the heat carried thereon to the heat absorption member 51 when the fluid contacts with the heat absorption member 51 to achieve water cooling heat dissipation.

In some other embodiments, the heat absorption member 51 can be, but not limited to, micro cylindrical structure. Further, in some other embodiments, the valve base 10, the valve base body 12, and the like structure of the fluid delivery device 1 can be formed of, but not limited to, heat absorption material such as metal material, for achieving heat exchange when the fluid is delivered between the valve base 10 and the valve base body 12 to further facilitate heat dissipation.

Figure 5:
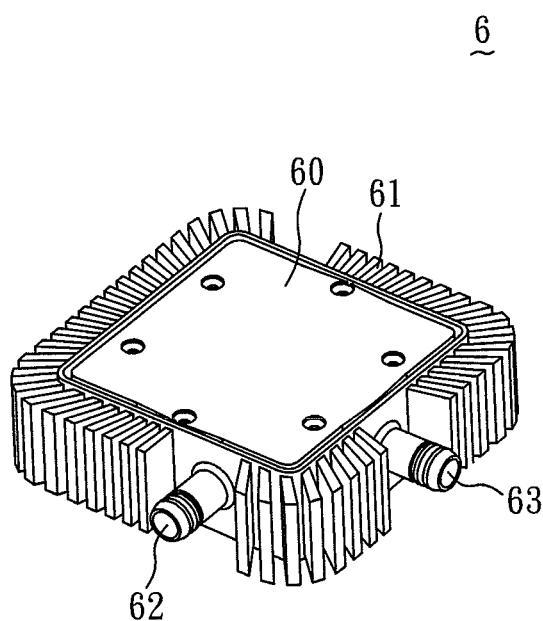
FIG. 5 is a schematic diagram displaying the structure of the heat absorption device of the fluid delivery device according to the third preferred embodiment of the present invention.

Please refer to FIG. 5, which is a schematic diagram displaying the structure of the heat absorption device of the fluid delivery device according to the third preferred embodiment of the present invention. In the present embodiment, the heat absorption device 6 has a main body 60, an entrance 62 and an exit 63, wherein the entrance 62 and the exit 63 are connected over a circular pipe, letting the heat absorption device 6 and the fluid delivery device 1 to be connected with each other and then forms a circular loop. Moreover, the main body 60 of the heat absorption device 6 contacts with heat generation device partially, so as to exchange heat with the heat generation device, but not limited to the above implementation. For increasing the efficiency of heat dissipation, plural of heat dissipation fins 61 can further be disposed on the main body 60 of the heat absorption device 6 in some embodiments. Otherwise, the main body 60 can further fabricates with a device that has heat dissipation fin 61 for increasing the efficiency of heat dissipation. Additionally, the design form of the heat absorption device 6 can be altered to satisfy each practical occasion, but not merely limited to the above implementation.

With the above description, the heat dissipation device of the present invention is mainly composed of a fluid delivery device and a circular pipe, which to propel the fluid to flow in the circular pipe by the operation of an actuating device of the fluid delivery device, and to delivery the heat generated by a heat generation device that contacts to the circular pipe with the fluid circularly, for dissipating the heat generation device. Moreover, heat exchange is done for the heat generation device through a heat absorption device, which is extra installed. The heat absorption device lets the heat energy to be delivered through the metal conduction between the heat absorption member and the convection within the fluid, and the heat absorption device is configured as a vertical type fin structure or as a micro cylindrical structure. The heat dissipation device of the present invention not only carries functions of heat absorption and heat dissipation, but also carries advantageous of thin thickness, low power consumption and broad application range.

Although the present invention has been explained in relation to its preferred embodiment, it is to be understood that many other possible modifications and variations can be made without departing from the spirit and scope of the invention as hereinafter claimed.

What is claimed is:

1. A heat dissipation device comprising:
   a fluid;
   a fluid delivery device comprising a top cover body, a cover body, a valve cover body, a valve film, a valve base, a bottom cover body, wherein said valve base has a liquid reservoir, and an actuating device is disposed onto the corresponding position of said valve cover body for propelling and delivering the fluid;
   a heat absorption device having a plurality of heat absorption members disposed in parallel with each other, said heat absorption is fabricated with said valve base, so as the plurality of heat absorption members are located in the liquid reservoir, and said heat absorption connects with a heat generation device, for absorbing the heat generated by the heat generation device; and
   a circular pipe connecting with the fluid delivery device and the heat absorption device, so as letting the heat absorbed by the heat absorption device to be conducted to the circular pipe by the fluid;
   wherein the fluid flows circularly in the circular pipe, and to dissipate heat from the heat generation device.

2. The heat dissipation device as claimed in claim 1, wherein the heat generation device can be an LED street lamp, or an LED vehicle lamp.

3. The heat dissipation device as claimed in claim 1, wherein the heat generation device can be a server, a tablet computer, a laptop computer, or a hand-held communication device.

4. The heat dissipation device as claimed in claim 1, wherein the fluid delivery device has an inlet and an outlet, and the two ends of the circular pipe respectively connect with the inlet and the outlet of the fluid delivery device.

5. The heat dissipation device as claimed in claim 1, wherein the circular pipe further has a plurality of heat dissipation fins.

6. The heat dissipation device as claimed in claim 1, wherein the circular pipe can further be fabricated with a heat dissipation fin.

7. The heat dissipation device as claimed in claim 1, wherein the heat absorption device further has a plurality of heat dissipation fins.

8. The heat dissipation device as claimed in claim 1, wherein the heat absorption device can further be fabricated with a heat dissipation fin.

* * * * *